United States Patent [19]

Dederer

[11] Patent Number: 4,912,843

[45] Date of Patent: Apr. 3, 1990

[54] METHOD FOR REPAIRING INTERCONNECT INTERRUPTIONS

[75] Inventor: Guenter Dederer, Munich, Fed. Rep. of Germany

[73] Assignee: Siemens Aktiengesellschaft, Berlin and Munich, Fed. Rep. of Germany

[21] Appl. No.: 327,994

[22] Filed: Mar. 23, 1989

[30] Foreign Application Priority Data

May 26, 1988 [DE] Fed. Rep. of Germany ....... 3817899

[51] Int. Cl.$^4$ ............................................... H05K 3/06
[52] U.S. Cl. .................... 29/846; 29/402.16;
174/261; 219/78.01; 219/86.21; 219/86.24;
219/119; 228/103; 228/119; 350/523; 427/140
[58] Field of Search ............................ 29/402.16, 846;
219/78.01, 86.21, 86.24, 86.9, 119, 158, 162;
228/103, 105, 119; 350/523; 427/140; 174/68.5

[56] References Cited

U.S. PATENT DOCUMENTS

| | | | |
|---|---|---|---|
| 4,418,264 | 11/1983 | Thorwarth | 29/402.16 X |
| 4,691,426 | 9/1987 | Roueek et al. | 29/833 X |
| 4,813,588 | 3/1989 | Srivastana et al. | 228/119 X |

*Primary Examiner*—Carl J. Arbes
*Attorney, Agent, or Firm*—Hill, Van Santen, Steadman & Simpson

[57] ABSTRACT

A method for repairing interconnect interruptions with congruent preforms. Congruent preforms that bridge an interconnect interruption are utilized for repairing interconnects whose width lies in the range from 50 through 70 μm and whose course is fashioned meander-like. Interconnects having a width of about 150 μm can be repaired with previous repair methods. Due to miniaturization of the interconnects, a special method for monitoring the congruent alignment between the preform and the interconnect at the location of the interruption as well as for monitoring the symmetrical bridging of an interconnect interruption is needed. This monitoring method occurs by monitoring with video camera, whereby the location of the interconnect interruption and the environment thereof, a preform that is congruent therewith, and the positioning of this preform relative to the interconnect interruption are viewed at different positions. The preform is held, aligned and positioned with only a single suction electrode from the time it is punched out until the time of the joining on the interconnect.

15 Claims, 2 Drawing Sheets

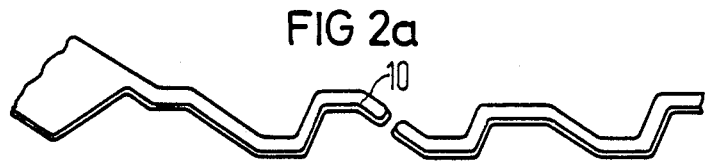
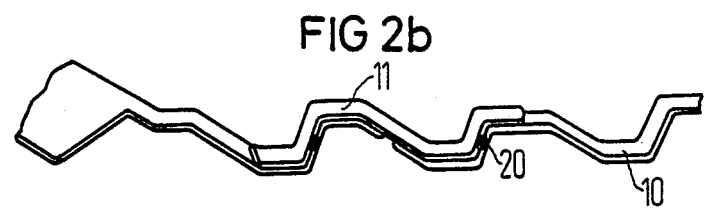
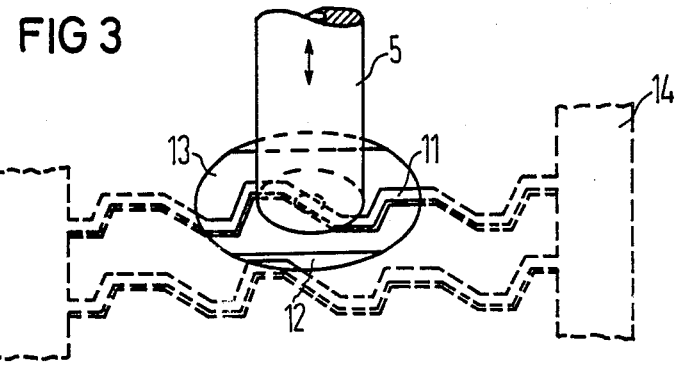
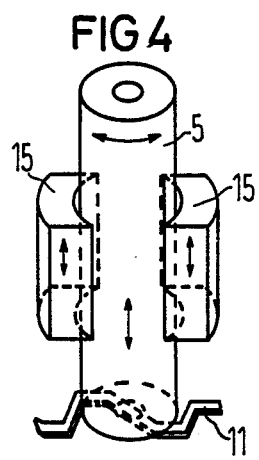
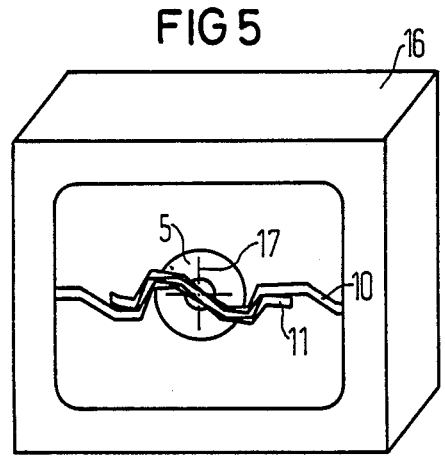

METHOD FOR REPAIRING INTERCONNECT INTERRUPTIONS

BACKGROUND OF THE INVENTION

The present invention is directed to a method for repairing interrupt connections with congruent preforms, which are connected to an interconnect at both sides of the interconnect interruptions by resistance heating. This is specifically directed to interconnects whose height, for example, amounts to 20 through 30 μm and whose width amounts to about 50 through 70 μm.

A method for repairing interconnect interruptions is already disclosed by German Published Application 30 25 875. A three-part electrode system has a central inside electrode equipped with a vacuum connection for creating a suction on a preform and, along with concentrically and hemispherically arranged outside electrodes, serves overall for picking up a preform, for depositing the preform and for connecting the preform to the interrupted interconnect. A hard solder connection is usually utilized for connecting by resistance heating. German Patent 22 51 997 discloses data from materials science and welding technology with respect to such a hard solder connection.

With continuing miniaturization of interconnects that have meander-like trapezoidal interconnect tracks and have dimensionings having, for example, width of less than 70 μm, repairs on printed circuit boards cannot be carried out with traditional methods. This is to be essentially attributed to the fact that monitoring with the human eye is no longer possible because of the small dimensions.

SUMMARY OF THE INVENTION

An object of the present invention is to provide a method for repairing interconnect interruptions that selects the required preforms which must be symmetrically congruent to the region of the interconnect interruption, picks them up and correspondingly deposits them on the interconnect interruption for connecting with resistance heating.

A method for repairing interconnect interruptions with congruent preforms, whereby these preforms are joined to the interconnect at both sides of the interconnect interruptions with resistance heating. The method has the steps of:
viewing each of the following with at least one black/white video camera of first, second and third black/white cameras, respectively; a location of the interconnect interruption and an environment thereof,
a preform congruent with the interconnect interruption and,
a positioning of the preform with respect to the interconnect interruption;
monitoring the congruency of the preform and interconnect at the interconnect interruption and the environment thereof by comparing the images of the first and second video cameras;
positioning of the preform relative to the interconnect interruption by comparing the images of the first and third video cameras;
comparing the images of the first, second and third black/white video cameras on a color monitor to whose three color inputs have connected the black/white video cameras in alternation between the first and second cameras or the first and third cameras.

A three-part electrode head, having a central rotatable suction electrode, centrally holds the preform and the preform is positioned relative to the interconnect interruption by turning the suction electrode and/or moving the three-part electrode head. A variety of preforms for different interconnect geometries are available in at least one press tool for being picked up by the suction electrode.

The first video camera and the second video camera as well as the first video camera and the third video camera can be each respectively replaced by a comparison microscope. When using video cameras a first color input of the color monitor is connected to the first video camera and a second color input of the color monitor is alternately connected to the second and third video cameras. A fourth video camera can be provided for viewing the preform lowered onto the interconnect interruption and for monitoring the weld.

The invention is based on the perception that reliable manipulation of preforms for the repair of interconnect interruptions with reference to their congruity and alignment to the interconnect can be realized only by use of video cameras at the locations of the interconnect interruption, at the area of selection of a preform and at the location of the comparison between preform and interconnect. The three black/white television pictures that can thereby be obtained are each applied to a color input of a color monitor and can guarantee an extremely exact monitoring of the congruity by optional mixing. This occurs with a color change that identifies the moment of congruity between two black/white pictures, each previously exhibiting its own color that was different from the other pictures. For congruity, a third, new color appears in the overlapping region.

An especially advantageous development of the present invention provides the utilization of a threepart electrode head that picks up the preform with a central, rotatably suction electrode, aligns it by rotation relative to the interconnect interruption and positions it thereon. By utilizing such an electrode head, the preform is held only by the suction electrode from the time it is picked up, for example in a magazine, until it is deposited onto the interconnect and no transfer events whatsoever are required.

The preforms needed for various interconnect geometries are expediently kept on hand in a supply means in order to deliver them to a press tool, whereby the suction electrode takes the punched preform directly from the press tool.

A further development of the present invention provides for the replacement of the first and of the second, as well as, of the first and of the third television cameras by a comparison microscope that correspondingly compares two images.

The three outputs of the three black/white video cameras connected to a color monitor can be advantageously coordinated to one input and either the second or the third video camera is connected to a second, common input in alternation. This has the advantage that the third color input is available for a further video camera and for additional monitoring functions.

Since the video cameras are pivoted away during the punching process and during the process of resistance joining, it is advantageous to utilize a fourth video camera in order to monitor the preform lowered onto the interconnect interruption during the joining process.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 2a is a perspective view showing an interconnect 10 with an interruption;

FIG. 2b is a perspective view showing an interconnect 10 with a preform 11 positioned congruently and symmetrically relative to the interconnect interruption of FIG. 2a;

FIG. 3 is a view showing the positioning of the suction electrode 5 and of the press tool 13 with reference to a preform panel 14 during a punching process;

FIG. 4 is a view showing the three-part electrode system with the separately rotatable suction electrode 5; and FIG. 5 shows a color monitor with monitor picture.

DESCRIPTION OF THE PREFERRED EMBODIMENT

Figure 1:
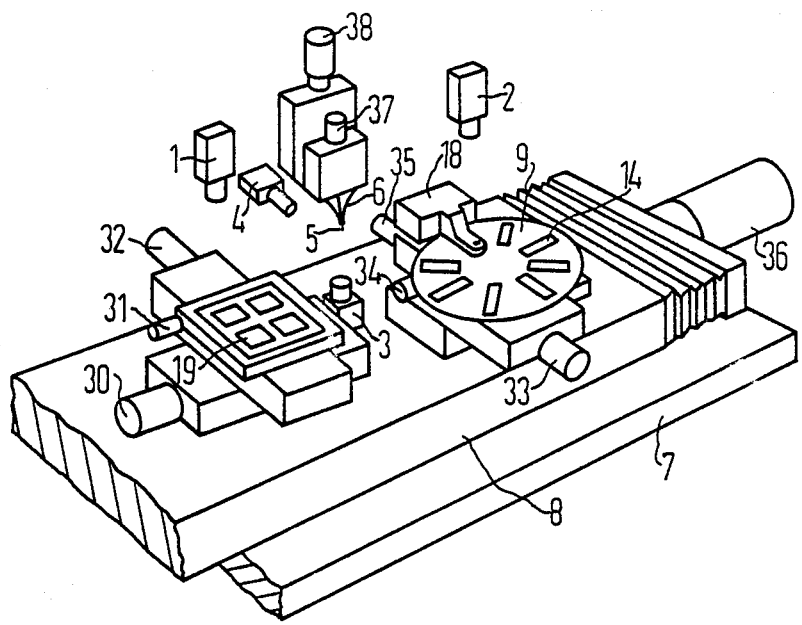
FIG. 1 is a perspective view showing an apparatus for the implementation of the method for repairing interconnect interruptions.

FIG. 1 shows video cameras 1 through 4. The first video camera 1 and the second video camera 2 view, first, a printed circuit board 19 having an interconnect interruption and, second, a magazine 9, in this case a round magazine, with a press tool 18. This occurs perpendicularly from above in both instances. Video camera 3 views the three-part electrode head 6 with the rotatable suction electrode 5 perpendicularly from below. Video camera 4 laterally and obliquely views the location at which the connection between preform 11 and interconnect 10 is carried out by resistance heating. This coincides with the position over the video camera 3. The apparatus seated on a stand 7 is further composed of a displacement table 8 that can be moved back and forth in one direction with a stepping motor 36. The movement in this respect is needed in order to displace the press tool 18 together with the magazine 9 and the printed circuit board 19 from the positions respectively shown to a position under the three-part electrode head 6 with the rotatable suction electrode 5. The stepping motors 30, 31 and 32 provide course and fine adjustment of the printed circuit board 19 with respect to a zero point defined on a color monitor 16. The same is true of the magazine 9, whereby the stepping motors 33, 34 are utilized. The stepping motor 35 is responsible for the movements of the press tool 18. The stepping motors 38, 37 move the electrode head 6 and the separately rotatable suction electrode 5.

FIG. 2a shows an interconnect 10 that has a defect in the form of an interruption. FIG. 2b shows a preform 11 that is congruent with the shape of the interconnect interruption and bridges or overlaps at both sides approximately uniformly, this preform 11 having been positioned onto the interconnect 10 and having been electrically and mechanically joined to the interconnect 10 by two joining zones 20 with hard soldering.

By way of example, FIG. 3 shows how a preform 11 is punched and suctioned with vacuum with the vertically lowerable and separately rotatable suction electrode 5, the stamping punch 13, of which only the base area is shown, and the die-plate opening 12.

Double arrows in FIG. 4 indicate in which directions the suction electrode 5 and the outside electrodes 15 can be moved. The electrodes 5, 15 are each independently displaceable in spherically guides and are resiliently supported. The suction electrode 5 projects centrally out of the pair of outside electrodes 15 in a downward direction since it must remove the preform 11 from the press tool 18 at a time in which the outside electrodes 15 are not being utilized. The joining process between preform 11 and interconnect 10 occurs by placing all three electrodes down, whereby a resistance welding or hard solder union is produced approximately symmetrically relative to the interconnect interruption between the suction electrode 5 and the outside electrodes 15.

It is shown in FIG. 5 how an interconnect 10 whose interconnect interruption lies roughly in the graticule 17 is repaired with a preform 11 by means of a color monitor 16. The graticule 17 represents the point of reference for the position respectively registered with a camera. The interconnect interruption can be centrally depicted on the color monitor 16 on the basis of this point of reference, as can be preform 11 that is symmetrically positioned relative to the interconnect interruption, i.e. overlapping uniformly at both sides. The sole point in time that cannot be viewed with one of the cameras 1, 2, or 3, namely the joining process with resistance heating, can be observed by the camera 4 obliquely from the side.

In this specific exemplary embodiment, the method of the present invention also contains the further, critical advantages:

The preforms 11 used can be manufactured of the following materials:

copper, nickel or an alloy such as, for example, "CuNi 30" can be used as a carrier material. The plating layer is preferably manufactured of "LAg72", whereby better joining properties were also achieved with the hard solder "LAg15 P5".

The press tool 18 is fashioned as a window press tool and has a laterally flattened, round stamping punch 13. This may be clearly seen in FIG. 3 with reference to the base area of the stamping punch 13 shown. Damage to neighboring preforms 11 can thereby be prevented in a preform panel 14 when punching a preform 11. This is likewise spacesaving for smaller division spacings in the preform panel 14.

All planar x-y movements ar controlled by stepping motors. As a result thereof, different interconnect configurations corresponding to the interconnect interruption can be selected from a plurality of preform panels 14 that are contained in magazines 9.

The provision of a plurality of window press tools for the acceptance of different, pre-punched preform panels in a variety of magazines is likewise possible in order to cover different interconnect geometries.

All stepping motors are designed in accordance with the dimensioning of the interconnects and of the repair preform so that the congruency can be precisely set upon comparison of a plurality of images.

The alignment of the third video camera 1 is selected such that the preform 11 held by the suction electrode 5 can be congruently positioned and, after the printed circuit board 19 has been removed under the suction electrode 5, the preform 11 lowered onto the interconnect.

Microscopes can also be partly employed instead of video cameras. It is thereby expedient to employ comparison microscopes (two objectives, one ocular). Comparison microscopes can be expediently utilized instead of the first and second video camera 1, 2, as well as instead of the first and third video camera 1, 3. Instead of the fourth video camera 4, an obliquely arranged stereo microscope can be aligned directly onto the interruption of the interconnect 10.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for repairing interconnect interruptions with congruent preforms, whereby these preforms are joined to the interconnect at both sides of the interconnect interruptions with resistance heating, comprising the steps of:

viewing each of the following with at least one black/white video camera of first, second and third black/white cameras, respectively;
   a location of the interconnect interruption and an environment thereof,
   a preform congruent with the interconnect interruption and,
   a positioning of the preform with respect to the interconnect interruption;
   monitoring the congruency of the preform and interconnect at the interconnect interruption and the environment thereof by comparing the images of the first and second video cameras; positioning of the preform relative to the interconnect interruption by comparing the images of the first and third video cameras;
   comparing the images of the first, second and third black/white video cameras on a color monitor to whose three color inputs have connected the black/white video cameras in alternation between the first and second cameras or the first and third cameras.

2. The method according to claim 1, wherein a three-part electrode head having a central, rotatable suction electrode centrally holds the preform and the preform is positioned relative to the interconnect interruption by turning the suction electrode and/or moving the three-part electrode head.

3. The method according to claim 3, wherein a variety of preforms for different interconnect geometries are available in at least one press tool for being picked up by the suction electrode.

4. A method for repairing interconnect interruptions with congruent preforms, whereby these preforms are joined to the interconnect at both sides of the interconnect interruptions with resistance heating, comprising the steps of:

viewing first and second images in a first comparison microscope and first and third images in a second comparison microscope;
   the fine image being a location of the interconnect interruption and an environment thereof,
   the second image being a preform congruent with the interconnect interruption and,
   the third image being a positioning of the preform with respect to the interconnect interruption;
   monitoring the congruency of the preform and interconnect at the interconnect interruption and the environment thereof by comparing the first and second images in the first comparison microscope;
   positioning of the preform relative to the interconnect interruption by comparing the first and third images in the second comparison microscope.

5. The method according to claim 1, wherein a first color input of the color monitor is connected to the first video camera and a second color input of the color monitor is alternately connected to the second and third video cameras.

6. The method according to claim 5, wherein a fourth video camera is provided for viewing the preform lowered onto the interconnect interruption and for monitoring the weld.

7. A method for repairing interconnect interruptions with congruent preforms, whereby these preforms are joined to the interconnect at both sides of the interconnect interruptions with resistance heating, comprising the steps of:

viewing with a first black/white video camera a location of the interconnect interruption and an environment thereof, viewing with a second black/white video camera
   a preform congruent with the interconnect interruption and,
   viewing with a third black/white video camera a positioning of the preform with respect to the interconnect interruption;
   monitoring the congruency of the preform and interconnect at the interconnect interruption and the environment thereof by comparing the images of the first and second video cameras; positioning of the preform relative tot he interconnect interruption by comparing the images of the first and third video cameras; comparing the images of the first, second and third black/white video cameras on a color monitor, a first color input of the color monitor being connected to the first video camera and a second color input of the color monitor being alternately connected to the second and third video cameras.

8. The method according to claim 7, wherein a three-part electrode head having a central, rotatable suction electrode centrally holds the preform and the preform is positioned relative to the interconnect interruption by turning the suction electrode and/or moving the three-part electrode head.

9. The method according to claim 8, wherein a variety of preforms for different interconnect geometries are available in at least one press tool for being picked up by the suction electrode.

10. A method for repairing interconnect interruptions with congruent preforms, whereby these preforms are joined to the interconnect at both sides of the interconnect interruptions with resistance heating, comprising the steps of providing at least a first and a second comparison microscope;

viewing to provide a first image a location of the interconnect interruption and an environment thereof;
   viewing to provide a second image a preform congruent with the interconnect interruption and, viewing to provide a third image with a third black/white video camera a positioning of the preform with respect to the interconnect interruption;

monitoring the congruency of the preform and interconnect at the interconnect interruption and the environment thereof by comparing the first and second images in the first comparison microscope;

positioning of the preform relative to the interconnect interruption by comparing the first and third images in the second comparison microscope.

11. The method according to claim 7, wherein a fourth video camera is provided for viewing the preform lowered onto the interconnect interruption and for monitoring the weld and is connected to a third input of the color monitor.

12. A method for repairing interconnect interruptions with congruent preforms, whereby these preforms are joined to the interconnect at both sides of the interconnect interruptions with resistance heating, comprising the steps of:

viewing with a first black/white video camera a location of the interconnect interruption and an environment thereof, viewing with a second black/white video camera a preform congruent with the interconnect interruption and, viewing with a third black/white video camera a positioning of the preform with respect to the interconnect interruption;

monitoring the congruency of the preform and interconnect at the interconnect interruption and the environment thereof by comparing the images of the first and second video cameras;

positioning of the preform relative to the interconnect interruption by comparing the images of the first and third video cameras;

comparing the images of the first, second and third black/white video cameras on a color monitor, a first color input of the color monitor being connected to the first video camera and a second color input of the color monitor being alternately connected to the second and third video cameras;

viewing with a fourth video camera the preform lowered onto the interconnect interruption and for monitoring the weld, a third color input of the color monitor being connected to the fourth video camera.

13. The method according to claim 12, wherein a three-part electrode head having a central, rotatable suction electrode centrally holds the preform and the preform is positioned relative to the interconnect interruption by turning the suction electrode and/or moving the three-part electrode head.

14. The method according to claim 13, wherein a variety of preforms for different interconnect geometries are available in at least one press toll for being picked up by the suction electrode.

15. A method for repairing interconnect interruptions with congruent preforms, whereby these preforms are joined to the interconnect at both sides of the interconnect interruptions with resistance heating, comprising the steps of:

viewing to provide a first image a location of the interconnect interruption and an environment thereof, viewing to provide a second image a preform congruent with the interconnect interruption and, viewing to provide a third image a positioning of the preform with respect to the interconnect interruption;

monitoring the congruency of the preform and interconnect at the interconnect interruption and the environment thereby comparing the first and second images in the first comparison microscope positioning of the preform relative to the interconnect interruption by comparing the images in the second comparison microscope;

viewing with a stereo microscope the preform lowered onto the interconnect interruption.

* * * * *